(12) United States Patent
Xu et al.

(10) Patent No.: US 10,379,651 B2
(45) Date of Patent: Aug. 13, 2019

(54) LINEAR POLARIZER AND DISPLAY DEVICE

(71) Applicant: BOE TECHNOLOGY GROUP CO., LTD., Beijing (CN)

(72) Inventors: Rui Xu, Beijing (CN); Xue Dong, Beijing (CN); Jing Lv, Beijing (CN); Haisheng Wang, Beijing (CN); Yingming Liu, Beijing (CN); Changfeng Li, Beijing (CN); Yuzhen Guo, Beijing (CN); Pinchao Gu, Beijing (CN); Yunke Qin, Beijing (CN); Yanan Jia, Beijing (CN); Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/575,883

(22) PCT Filed: Jun. 14, 2017

(86) PCT No.: PCT/CN2017/088188
§ 371 (c)(1),
(2) Date: Nov. 21, 2017

(87) PCT Pub. No.: WO2018/120664
PCT Pub. Date: Jul. 5, 2018

(65) Prior Publication Data
US 2018/0356923 A1      Dec. 13, 2018

(30) Foreign Application Priority Data

Dec. 28, 2016  (CN) .......................... 2016 1 1234703

(51) Int. Cl.
*G06F 3/041* (2006.01)
*H01L 27/32* (2006.01)
(Continued)

(52) U.S. Cl.
CPC ......... *G06F 3/0412* (2013.01); *G02B 5/3058* (2013.01); *G06F 3/044* (2013.01);
(Continued)

(58) Field of Classification Search
CPC ...... G06F 3/0412; G06F 3/0416; G06F 3/044; G06F 2203/04105; G02B 5/3058; H01L 27/323; H01L 51/5284
See application file for complete search history.

(56) References Cited

U.S. PATENT DOCUMENTS

| 2015/0055057 A1 | 2/2015 | Huang |
| 2016/0231844 A1 | 8/2016 | Lee et al. |

FOREIGN PATENT DOCUMENTS

| CN | 102915167 A | 2/2013 |
| CN | 103336382 A | 10/2013 |

(Continued)

OTHER PUBLICATIONS

International Search Report from PCT/CN2017/088188 dated Aug. 2, 2017 (14 pages).

*Primary Examiner* — Peter D Mcloone
(74) *Attorney, Agent, or Firm* — Calfee, Halter & Griswold LLP

(57) ABSTRACT

The present disclosure relates to display technology and discloses a present disclosure and a display device. The linear polarizer includes a base plate and a plurality of shading stripes equally spaced in parallel on the base plate, with a transparent stripe formed between every two shading stripes adjacent to each other, wherein the shading stripes are made of a conductive material; at least a portion of the shading stripes are also configured to detect touch position.

18 Claims, 3 Drawing Sheets

(51) Int. Cl.
*H01L 51/52* (2006.01)
*G06F 3/044* (2006.01)
*G02B 5/30* (2006.01)

(52) U.S. Cl.
CPC .......... *G06F 3/0416* (2013.01); *H01L 27/323* (2013.01); *H01L 51/5281* (2013.01); *H01L 51/5284* (2013.01); *G06F 2203/04105* (2013.01)

(56) References Cited

FOREIGN PATENT DOCUMENTS

| | | |
|---|---|---|
| CN | 105224126 A | 1/2016 |
| CN | 106597597 A | 4/2017 |
| CN | 206274351 U | 6/2017 |

LINEAR POLARIZER AND DISPLAY DEVICE

CROSS REFERENCE

The present application is based upon International Application No. PCT/CN2017/088188, filed on Jun. 14, 2017, which is based upon and claims priority to Chinese Patent Application No. 201611234703.6, filed on Dec. 28, 2016, and the entire contents thereof are incorporated herein by reference.

TECHNICAL FIELD

The present disclosure relates to display technology, and more specifically, to a linear polarizer and a display device.

BACKGROUND

The organic light emitting diode (OLED) display has begun to gradually replace the LCD display due to its possessing such characteristics as high contrast, low thickness, wide viewing angle, fast response, etc. Integrating touch control function into the OLED has generated a high level of attention. OLED displays on the current market can only provide display function, and an additional and separate touch screen is attached to the OLED display. The module structure thus obtained has no advantage in thickness as compared with the in cell touch LCD. In order to reduce the thickness, in the prior art, another method is employed for realizing touch control function by depositing touch control electrodes on the package film of the OLED display screen through low-temperature sputtering.

It should be noted that, information disclosed in the above background portion is provided only for better understanding of the background of the present disclosure, and thus it may contain information that does not form the prior art known by those ordinary skilled in the art.

SUMMARY

The present disclosure provides a linear polarizer and a display device.

In order to solve the above technical problem, the embodiment of the present disclosure provides a linear polarizer including a base plate and a plurality of shading stripes equally spaced in parallel on the base plate, with a transparent stripe formed between every two of the plurality of shading stripes adjacent to each other, wherein the shading stripes comprises a conductive material, and at least a portion of the shading stripes are also configured to detect touch position.

The embodiment of the present disclosure further provides a display device, including: a display panel; a line polarizer provided on a display side of the display panel; and a quarter-wave plate disposed on a side of the linear polarizer away from the display panel, wherein the linear polarizer is any one of the linear polarizer described above;

the display device further includes a control unit and a first touch-control drive circuit, the first touch-control drive circuit is electrically connected to at least a portion of the shading stripes, and the control unit is configured to control the first touch-control drive circuit in the first time period so as to acquire a first touch signal and determine touch position.

It is to be understood that both the foregoing general description and the following detailed description are exemplary and explanatory only and are not restrictive of the present disclosure, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the embodiments of the present disclosure or the technical solutions in the prior art, the drawings, which are to be used in the description of the embodiments or the prior art, will be briefly described. It will be apparent that the drawings in the following description are just embodiments of the present disclosure, and other drawings may be obtained for those skilled in the art based on these drawings without any inventive work.

DETAILED DESCRIPTION

Hereinafter, specific embodiments of the present disclosure will be described in further detail with reference to the accompanying drawings and embodiments. The following embodiments are intended to illustrate the present disclosure, instead of limiting the scope of the present disclosure.

Embodiment 1

The present disclosure provides a linear polarizer including a plurality of parallel shading stripes. The shading stripes are made of a conductive material, and at least a portion of the shading stripes are connected to the first touch-control drive circuit for detecting the touch position. In the technical solutions of the present disclosure, the shading stripes of the linear polarizer are multiplexed as touch control electrodes, so that it is not necessary to manufacture a separate touch screen and thus the production cost is reduced.

Figure 1:
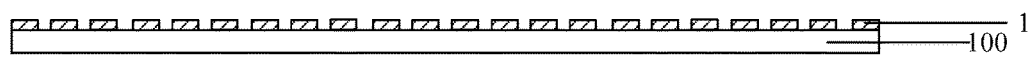
FIG. 1 schematically illustrates the configuration of the linear polarizer in embodiments of the present disclosure.
Figure 2:
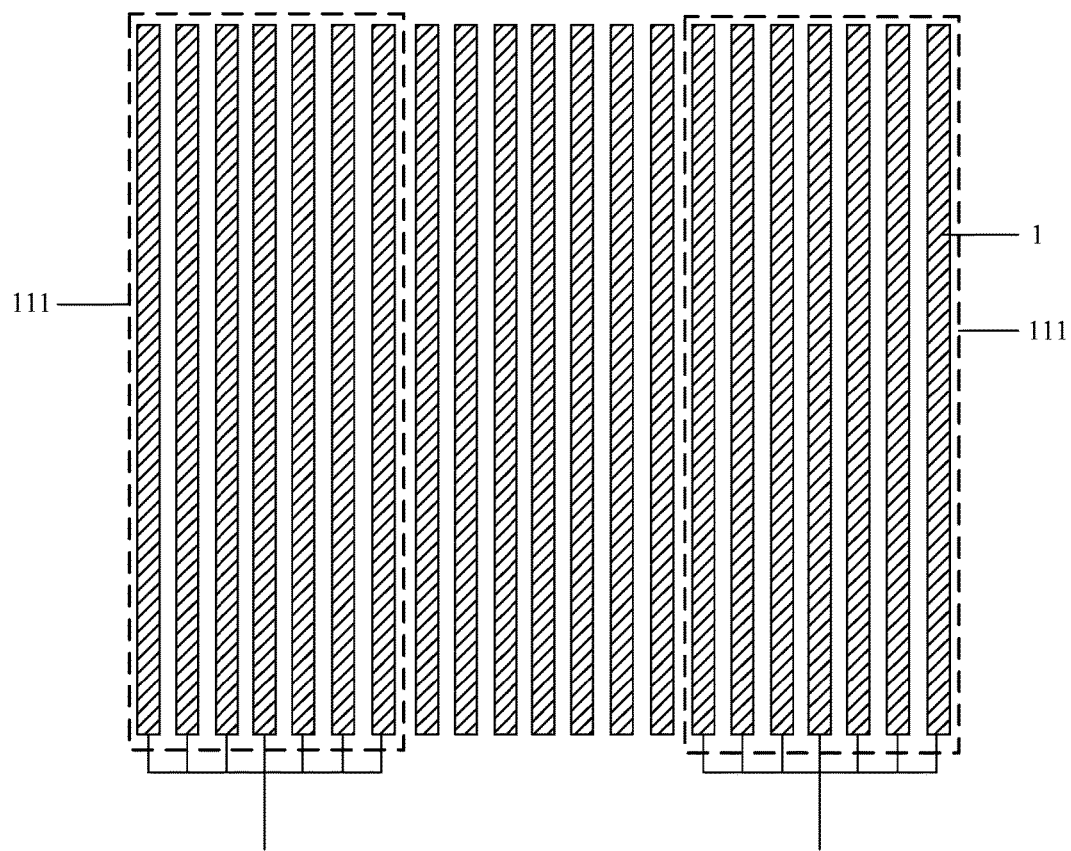
FIG. 2 is the first top view of the linear polarizer in embodiments of the present disclosure.
Figure 3:
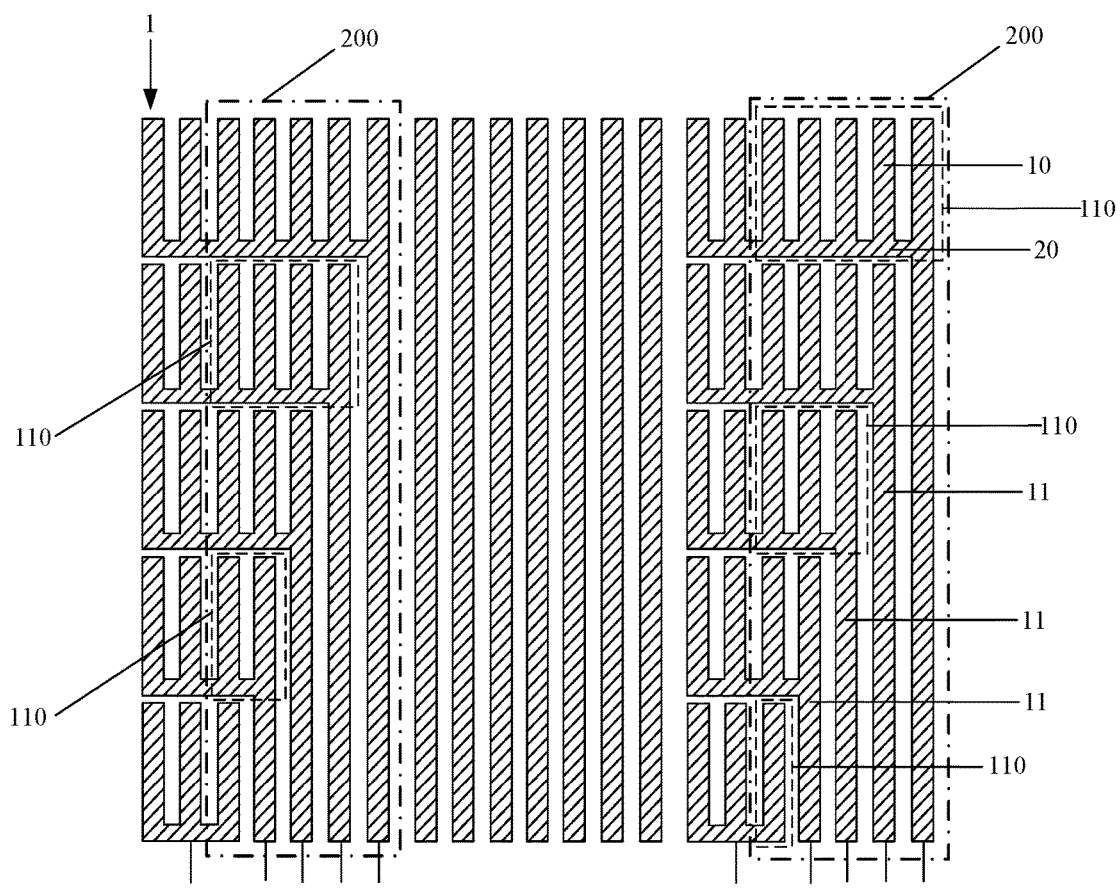
FIG. 3 is the second top view of the linear polarizer in embodiments of the present disclosure.

As shown in FIG. 1 to FIG. 3, the linear polarizer in the present embodiment includes a base plate 100 and a plurality of parallel shading stripes 1 arranged on the base plate 100. A transparent stripe is formed between two adjacent shading stripes 1. The shading stripes are made of conductive materials, for example metal materials such as Cu, Al, Mo, Cr, Nd, Ni, Mn, Ti, Ta, W, etc and the alloy thereof, such that at least a portion of the shading stripes 1 may be multiplexed as touch control electrodes for detecting the touch positions.

Based on the accuracy of the touch detection, the line polarizer may be arranged including a plurality of touch detection areas. The shading stripes (or a portion of the shading stripes) located in the touch detection areas are connected to the first touch-control drive circuit for detecting the touch positions, which can meet the requirement of the touch detection accuracy. That is, a plurality of shading stripes (or a portion of the shading stripes) located in the touch detection areas form the touch control electrodes through being electrically connected.

It is noted that the touch detection areas in the present disclosure refer to the area where the touch control electrodes are located.

The touch control electrodes are of various configurations and arrangements suitable for different ways of touch detection. As an example, a touch detection method adopting mutual capacitance is described. In this method, a plurality of second parallel touch control electrodes and a plurality of third parallel touch control electrodes are involved. The second touch control electrodes and the third touch control electrodes intersect, forming mutual capacitance at the intersections. A touch from a finger will affect the coupling between the two electrodes near the touch point, changing the capacitance between the two electrodes. For detecting the mutual capacitance, the drive signal can be transmitted to the third touch control electrodes in turn, and the second touch control electrodes receive signals. When the mutual capacitance changes, the horizontal coordinate and the vertical coordinate can be determined and thus the touch position is determined.

In the present embodiment, when the touch detection through the mutual capacitance is adopted, on the linear polarizer it is provided with only the second touch control electrodes. Specifically, as shown in FIG. 2, the linear polarizer includes a plurality of second parallel touch detection areas 111 which extend in the same direction as the shading stripe 1. The plurality of shading stripes 1 in one second touch detection areas 111 are electrically connected and form a second touch control electrode. The shading stripes 1 in different second touch detection areas 111 are insulated from each other, and the adjacent second touch detection areas 111 are spaced apart from each other by a certain distance. During the touch detection, the first touch-control drive circuit may sequentially acquire the first touch signal corresponding to the shading stripes 1 in the second touch detection area 111. For each of the second touch detection areas 111, since the plurality of shading stripes 1 are electrically connected only at one of their ends, forming a first touch electrode having a stripe shape, which will not impact the polarization characteristic of the linearly polarized light. Moreover, no additional film is needed, and the structure is simple and can be achieved easily.

The shading stripes 1 located between the two second touch detection areas 111 adjacent to each other can be grounded, connected to a fixed power supply, or floated, which is not limited herein. That the shading stripes 1 being floated may include that the shading stripes 1 are neither electrically connected to any other electrical structures nor ground or fixed power supply.

In the above-described technical solution, the second touch control electrodes for the mutual capacitance touch detection are formed with the shading stripes 1 of the linear polarizer, and the third touch control electrodes for the mutual capacitance touch detection are not provided on the linear polarizer. It is conceivable that the third touch control electrode can also be fabricated on the linear polarizer using a transparent conductive material, intersecting with the first touch control electrodes and forming mutual capacitance at the intersection therebetween to detect the touch position. The specific structure may be such that an insulating layer is provided on the shading stripes, the insulating layer covers the entire linear polarizer, and a plurality of third parallel touch control electrodes are formed on the insulating layer. Since the third touch control electrodes are made of a transparent conductive material, the polarization characteristic of the linear polarizer will not be affected.

As an example, a touch detection method adopting mutual capacitance is described to introduce a specific structure in the present disclosure for forming touch control electrodes using shading stripes of a linear polarizer. It is to be noted that, the technical solution of the present disclosure is not only limited to the touch position detection method using mutual capacitance, but also may be applied to other ways of realizing touch position detection by utilize touch electrodes, for example, a self-capacitance touch detection method.

In a self-capacitance touch position detection method, the intersected second control touch electrodes and third touch control electrodes are involved as in the mutual capacitance touch position detection method, except for that the second touch control electrodes and the third touch control electrodes respectively form capacitors with the ground. This capacitor is commonly referred to as self-capacitance, i.e., the capacitance formed between the electrode and the ground. When touching, the capacitance of the finger will be superimposed on the capacitance of the screen body, increasing the capacity of the screen. When touching, the first touch signal corresponding to the second touch control electrodes and the third touch control electrodes are sequentially obtained respectively, and the horizontal coordinate and the vertical coordinate are determined according to the capacitance variation, which then form plane coordinates so that the touch position is determined. When the technical solution of the present disclosure is applied to the self-capacitance touch position detection, the structure of the touch electrode is the same as that of the mutual capacitance touch position detection described above, which will not be repeated herein.

In another embodiment of the self-capacitance touch position detection method, as shown in FIG. 3, the linear polarizer may also be provided with a plurality of block shaped first touch detection areas 110. The first touch detection areas 110 are arranged in an array. Each of the first touch detection areas 110 corresponds to a touch detection point. Different first touch detection areas 110 are connected to the first touch-control drive circuit independently (the first touch detection areas 110 being connected to the first touch-control drive circuit may include that the touch control electrodes within the first touch detection areas 110 are connected to the first touch-control drive circuit). The first touch-control drive circuit is configured to acquire the first touch signal corresponding to each of the first touch detection areas 110 so as to determine the touch position. Specifically, the first touch detection areas 110 may be encoded. When the first touch-control drive circuit detects that one first touch detection area 110 or at least two first touch detection areas 110 are touched, the touch position can be determined according to its encoding.

FIG. 3 schematically illustrates the structure of the first touch detection areas 110. The shading stripes 1 are patterned and include first sub-line segments 10 located in the first touch detection areas 110. A plurality of the first sub-line segments 10 within one first touch detection area 110 are electrically connected to form a first touch electrode, and the first sub-line segments 10 in different first touch detection areas 110 are insulated from each other. The portions of the shading stripes 1 that are not located within the first touch detection areas 110 and the entire shading stripes 1 that are not located within the touch detection areas 110 may be grounded, connected to a fixed power supply or floated, which is not limited herein.

In a specific embodiment, a plurality of mutually independent first touch electrodes are formed by the following approaches.

As shown in FIG. 3, the linear polarizer includes a plurality of shading stripe groups 200. Each of the shading stripe groups 200 includes N shading stripes. A number of second shading stripes are located between two shading stripe groups 200 adjacent to each other. The number of the second shading stripes between the adjacent shading stripe groups 200 may be determined according to the accuracy of the touch detection. For example, there is provided at least one second shading stripe between the two shading stripe groups 200 adjacent to each other.

Each of the shading stripe groups 200 forms a group of first touch detection areas 110. As shown in FIG. 3, the shading stripes are segmented in their extending direction to form a plurality of first sub-line segments (see the foregoing embodiment). The first touch control electrodes of each of the first touch detection areas 110 are electrically connected to second sub-line segments. The second sub-line segments are formed by a portion of the shading stripes, extend to the outside of the first touch detection areas 110 and are electrically insulated from other first touch detection areas 110. For example, the second sub-line segments do not pass through (e.g., do not intersect with) other first touch detection areas 110. In one embodiment, as shown in FIG. 3, the second sub-line segments corresponding to each of the first touch detection areas 110 are provided on the same side of each of the first touch detection areas 110. For example, as shown in FIG. 3, each of the second sub-line segments are disposed on the right side of their corresponding first touch detection areas 110 such that in the overall layout of the linear polarizer, each of the second sub-line segments does not pass through (e.g., does not intersect) other first touch detection areas 110. The person skilled in the art should understand that the present disclosure is not limited to the layout shown in FIG. 3.

For each of the shading stripe groups 200, the first shading stripe 1 is sequentially divided into N first sub-line segments 10 with a length of d in the extending direction of the shading stripes 1. The $n_{th}$ shading stripe 1 is sequentially divided into (N−n) first sub-line segments with a length of d and a second sub-line segment 11. The $N_{th}$ shading stripe 1 is not divided.

For each of the shading stripe groups 200, in the extending direction of the shading stripes 1, the first one of the first sub-line segments 10, among all of the shading stripes 1 which have the first sub-line segments 10, is electrically connected to the $N_{th}$ shading stripe 1 through a first connecting line 20 and forms a first touch control electrode; The $n_{th}$ one of the first sub-line segments 102, among all of the shading stripes 1 which have at least n first sub-line segments, is electrically connected to the $(N-n)_{th}$ second sub-line segment 11 through a first connecting line 20 and forms a first touch control electrode; The $N_{th}$ first sub-line segment 10 of the first shading stripe forms a first touch control electrode, wherein N and n are positive integers and n is less than N.

It is noted that, the first shading stripe 1, the second shading stripe 1 . . . the $n_{th}$ shading stripe 1 . . . the $N_{th}$ shading stripe 1 are defined in an order along a direction perpendicular to the extending direction of the shading stripes; the first one of the first sub-line segments 10, the second one of the first sub-line segments 10 . . . the $n_{th}$ one of the first sub-line segments 10 . . . the $N_{th}$ one of the first sub-line segments 10 are defined in an order along the extending direction of the shading stripes. The first one of the second sub-line segments 11, the second one of the second sub-line segments 11 . . . the $n_{th}$ one of the second sub-line segments 11 . . . the $N_{th}$ one of the second sub-line segments 11 are defined in an order along a direction perpendicular to the extending direction of the shading stripes.

Optionally, the first connecting lines 20 may be integrally formed with the first sub-line segments 10 in the same layer by one patterning process to the same conductive film so as to simplify the fabrication process. The distance between the adjacent first connecting lines 20 is relatively large and thus their impact on the polarization characteristic of the linear polarizer is less. When the linear polarizer is applied to the display device, in order not to affect the display, the position of the first connection line 20 is arranged corresponding to the area between the two pixel areas adjacent to each other. Since the linear polarizer applied display device only applies polarization to the light from the pixel areas, the arrangement of the first connecting line 20 will not affect the polarization characteristic of the linear polarizer.

In the above-described technical solution, the first sub-line segments 10 are formed in the first touch detection areas 110 by patterning the shading stripes 1. The first sub-line segments within one first touch detection area 110 are electrically connected and form a first touch control electrode. The first touch control electrodes are arranged in an array and connected to the first touch-control drive circuit. The first touch-control drive circuit acquires the first touch signal corresponding to each of the first touch control electrodes so as to determine the touch position. The number of the touch control electrodes may be determined according to the accuracy of the touch detection.

In practice, in order to increase the detection area of the first touch electrode, as for each of the shading stripe groups 200, in the extending direction of the shading stripe 1, the plurality of the shading stripe 1 close to the first shading stripe 1 are divided into N first sub-line segment 10 of a length of d. The first sub-line segments 10 of the plurality of shading stripes 1 are connected to the first touch control electrode at corresponding positions so as to increase the detection area corresponding to the first touch control electrode.

According to the technical solution of the above-described embodiments, it is further possible to provide a piezoresistor on the surface of the first touch control electrode that is opposed to the base plate. The first touch control electrode is also connected to a second touch-control drive circuit. Since the resistance of the piezoresistor decreases when being applied with pressure, the amount of pressure of the touch may be determined from its resistance.

In order to detect the touch position and the amount of the touch pressure simultaneously by one first touch control electrode, it is possible to provide a control unit for controlling the first touch-control drive circuit in a first period to acquire the first touch signal corresponding to the first touch electrode so as to determine the touch position, and controlling the second touch-control drive circuit in a second time period to acquire the second touch signal corresponding to the second touch control electrode so as to the determine the amount of the touch pressure. The first time period does not overlap with the second time period. When the linear polarizer is applied in display devices, the piezoresistor configured to sense the amount of touch pressure is arranged corresponding to the area between the adjacent pixel areas, so that the aperture ratio will not be affected.

Figure 4:
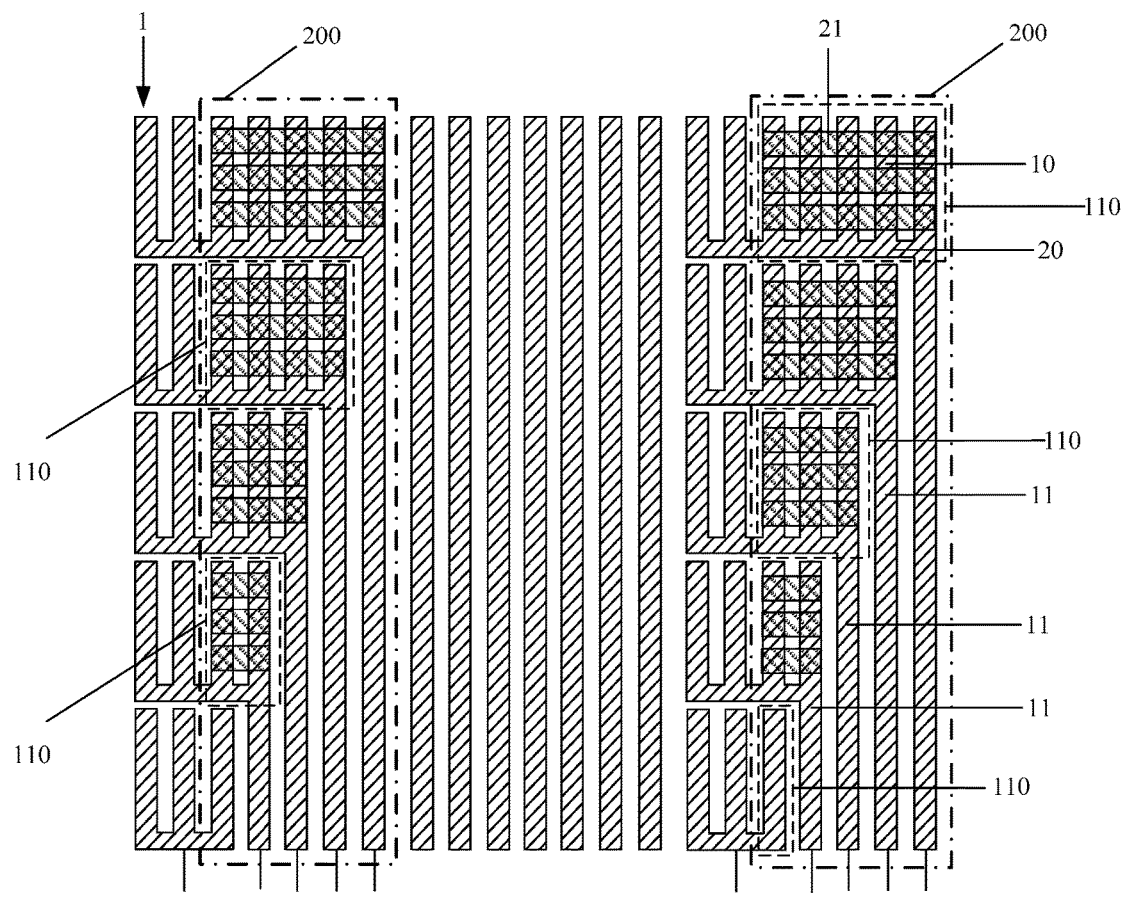
FIG. 4 is the third top view of the linear polarizer in embodiments of the present disclosure.

In order to further increase the contact area between the first touch control electrode and the piezoresistor, as shown in FIG. 4, the first touch control electrode further includes a plurality of second connecting lines 21. The second connecting lines 21 intersect with the first sub-line segments 10 and are arranged corresponding to the area of the piezoresistor. The arrangement of the second connecting line 21 increases the contact area between the first touch control electrode and the piezoresistor. Optionally, the second connecting lines 21 may be integrally formed with the first sub-line segments 10 in the same layer by one patterning process to the same conductive film so as to simplify the fabrication process.

In the above-described technical solution, the touch control electrode for detecting the amount of the touch pressure is the same touch control electrode as the first touch control electrode for detecting the touch position. It is conceivable that it is possible to provide independent touch control electrodes to detect the amount of touch pressure.

Obviously, the ways of detecting the amount of touch pressure are not limited to the usage of pressure sensitive material, and other ways to realize the detection may be equally possible. For example, in a detecting method by forming a detecting capacitance, when the area where the capacitance is located is applied with pressure, the distance between the two electrodes are decreased and thus the capacitance varies, and the amount of pressure may be determined based on the amount of the change of the capacitance; or in a detecting method by providing conducting columns, when no pressure is applied, the conducting columns are in contact with only one electrode, and when a pressure is applied, a certain number of conducting columns are in contact with the other electrode. The amount of pressure may be determined according to the signal corresponding to different numbers of conducting columns.

The first touch control electrode may also detect the touch position by means of mutual capacitance. It is only necessary to short the first touch control electrodes within the first touch detection areas 110 of the same column when detecting the touch position. The specific detection principle has been described in the above description, and will not be repeated herein.

It is noted that in the embodiments of the present disclosure, defining the extending direction of the shading stripes 1 as the column direction is only for the sake of convenience in describing, and does not have any limiting effect.

Embodiment 2

In the present embodiment, there is provided a display device including: a display panel; a line polarizer 2 provided on a display side of the display panel; and a quarter-wave plate 8 disposed on the side of the linear polarizer 2 away from the display panel. After the light for display passes through the linear polarizer 2, a linearly polarized light is formed. The linearly polarized light passes through the quarter-wave plate 8 to form a circularly polarized light. The combination of the polarizer 2 and the quarter-wave plate 8 may absorb the reflected light, reduce the interference caused by the reflected ambient light, and enhances the contrast. The display device may further include a package film 30 disposed on the side of the quarter-wave plate 8 away from the display panel and a protective plate 31 disposed on the side of the package film 30 away from the display panel. The package film 30 is configured to block the water and oxygen, and the protective plate 31 may be a glass plate for protecting the package film 30. The package film 30 and the protective plate 31 may be fixedly bonded by an optical adhesive layer 32.

The linear polarizer 2 utilizes the linear polarizer in the first embodiment and form touch electrodes using the shading stripes of the linear polarizer 2 to realize the embedded touch control and to reduce the thickness of the product. Additionally, the display panel will not be affected and the product performance may be ensured.

The display device further includes a control unit and a first touch-control drive circuit. The first touch-control drive circuit is electrically connected to at least a portion of the shading stripes. The control unit is configured to control the first touch-control drive circuit in the first time period so as to acquire the first touch signal and determine the touch position.

Specifically, the shading stripes may be patterned so that the shading stripes may include first sub-line segments. In the adjacent multiple shading stripes, the first sub-line segments at corresponding areas are connected electrically to form a block shaped first touch control electrode. The first touch control electrodes are arranged in an array and form a mutual capacitance with the ground, so that a mutual capacitance touch detection is realized. In order to realize the mutual capacitance touch detection, it is also possible to connect electrically the multiple adjacent shading stripes to form a strip-like second touch control electrode which serves as a touch control electrode of the mutual capacitance touch detection.

The display device may be a liquid crystal display device, an organic light emitting diode display device, or the like. Particularly, for the organic light emitting diode display device, since it is not necessary to fabricate a touch electrode on the package film to realize the embedded touch control, the packaging effect is ensured.

In a specific embodiment, the touch position is detected in a mutual capacitance manner. The display device includes a plurality of parallel second touch control electrodes and a plurality of parallel third touch control electrodes. The second touch control electrodes and the third touch control electrodes intersect and the mutual capacitance are formed at the intersections thereof. The second touch control electrode are formed by the shading stripes of the linear polarizer, and the third touch control electrodes may be independently provided on the display panel or multiplex the conductive structure of the display panel. In order to simplify the structure, optionally the third touch control electrodes may multiplex the conductive structure of the display panel. Hereinafter, an organic electroluminescent display device is taken as an example.

Figure 5:
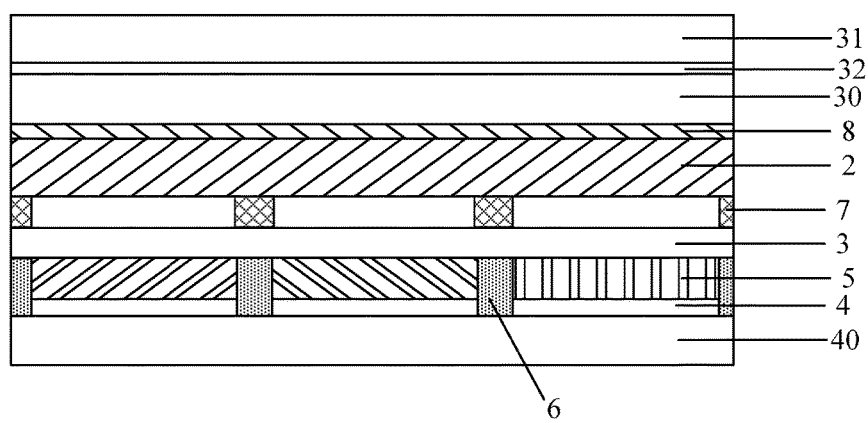
FIG. 5 is a structure diagram of a display device in embodiments of the present disclosure.

As shown in FIG. 5, for the organic light emitting diode display device, the display panel is an organic light emitting diode display panel including a pixel defining layer 6 for defining a plurality of pixel areas. Each of the pixel areas includes an organic light emitting diode. The organic light emitting diode includes a first electrode 3, a second electrode 4, and a light emitting layer 5 disposed between the first electrode 3 and the second electrode 4. The first electrode 3 is disposed on the light emitting side of the display panel;

The first electrode 3 is a stripe-like electrode. The first electrode 3 intersects with the first touch control electrode. The first touch control electrode and the first electrode 3 cooperate to detect the touch position.

Since the first electrode 3 of the organic electroluminescent diode is multiplexed as the other touch control electrode of the mutual capacitance touch detection, the control unit is configured to control the first touch-control drive circuit in the first time period within the display period of one frame so as to acquire the first touch signal and determine the touch position. When a common voltage is applied to the first electrode 3 and a pixel voltage is applied to the second electrode 4 to control the display process, the detection of the touch position and the display process do not affect each other. It is possible to detect the touch position at any time period within the display period of a frame.

In another embodiment, the touch position is detected by self-capacitance. The linear polarizer includes a plurality of block shaped first touch control detection areas arranged in an array. The first touch detection area is provided with first touch electrodes. The first touch control electrodes are connected to the first touch-control driving circuit independently of each other. The control unit is configured to control the first touch-control drive circuit in the first time period so as to acquire the first touch signal and determine the touch position.

The display device further includes piezoresistors 7 located between the first touch electrode and the first electrode 3. One surface of the piezoresistors 7 is arranged in contact with the first touch control electrode, and the other surface is arranged in contact with the first electrode 3. The piezoresistors are disposed corresponding to the areas between the adjacent pixel areas, i.e., corresponding to the area where the pixel defining layer 6 is located. The resistance of the piezoresistor 7 varies as the touch pressure changes, such that the amount of the touch pressure can be realized.

The display device further includes a second touch-control drive circuit. The second touch-control drive circuit is electrically connected to the first electrode 3 and the first touch control electrode. The control unit is also configured to control the second touch-control drive circuit in the second time period within the display time of a frame so as to acquire the second touch signal and determine the touch position. When a common voltage is applied to the first electrode 3, the detection to the amount of the touch pressure and the display process do not affect each other. It is possible to detect the touch position at any time period within the display period of a frame. It is only necessary to ensure that the first time period does not overlap with the second time period.

Optionally, the piezoresistor 7 may be arranged on the surface of the first electrode that is facing to the linear polarizer 2.

The above embodiments are merely the preferred embodiments of the present disclosure. It is noted that, those skilled in the art could make improvements and modifications without going beyond the principle in the present disclosure, which should be considered falling into the scope of the present disclosure.

What is claimed is:

1. A linear polarizer, comprising:
a base plate;
a plurality of shading stripes equally spaced in parallel on the base plate;
a transparent stripe formed between every two of the plurality of shading stripes adjacent to each other, wherein the shading stripes comprise a conductive material, and at least a portion of the shading stripes is also configured to detect touch position; and
a plurality of first touch detection areas having a block shape and arranged in an array,
wherein the shading stripes comprise first sub-line segments which are located in the first touch detection areas, wherein the first sub-line segments within one of the plurality of first touch detection areas are electrically connected to form a first touch control electrode, and wherein in an extending direction of the plurality of shading stripes, the first sub-line segments within different first touch detection areas are insulated from each other.

2. The linear polarizer of claim 1 further comprising a plurality of second touch detection areas arranged in parallel, wherein the shading stripes within one of the plurality of second touch detection areas are electrically connected to form a second touch control electrode, and the shading stripes within different first touch detection areas are insulated from each other.

3. The linear polarizer of claim 1 further comprising a plurality of shading stripe groups, wherein each of the shading stripe groups comprises a plurality of first shading stripes adjacent to each other, each of the shading stripe groups forms a group of the first touch detection areas;
the first shading stripes are divided in their extending direction to form the first sub-line segments, the first touch control electrode in each of the first touch detection areas is electrically connected to a second sub-line segment;
wherein the second sub-line segment is formed with a portion of the first shading stripe, and is extended to the outside of the first touch detection area and is electrically insulated with other first touch detection areas.

4. The linear polarizer of claim 3, wherein at least a second shading stripe is provided between two of the plurality of shading stripe groups adjacent to each other.

5. The linear polarizer of claim 3, wherein the second sub-line segment corresponding to each of the first touch detection areas is arranged at the same side of each of the first touch detection areas.

6. The linear polarizer of claim 3, wherein a piezoresistor is provided on a surface of the first touch control electrode that is opposed to the base plate.

7. The linear polarizer of claim 6, wherein the first touch control electrode further comprises a plurality of second connecting lines, the second connecting lines intersect with the first sub-line segments and are arranged corresponding to the area of the piezoresistor.

8. The linear polarizer of claim 7, wherein the first connecting lines are integrally formed with corresponding first sub-line segments and the second sub-line segments; and the second connecting lines are integrally formed with corresponding first sub-line segments.

9. The linear polarizer of claim 1 further comprising a plurality of shading stripe groups, wherein each of the shading stripe groups comprises N adjacent shading stripes, wherein a number of second shading stripes are arranged between the two of the plurality of shading stripe groups adjacent to each other;
for each of the shading stripe groups, the first shading stripe is sequentially divided into N first sub-line segments with a length of d in the extending direction of the shading stripes, the $n_{th}$ shading stripe is sequentially divided into (N−n) first sub-line segments with a length of d and a second sub-line segment;
for each of the shading stripe groups, in the extending direction of the shading stripes, the first one of the first sub-line segments, among all of the shading stripes which have the first sub-line segments, is electrically connected to the $N_{th}$ shading stripe through a first connecting line and forms a first touch control electrode; the $n_{th}$ one of the first sub-line segments, among all of the shading stripes which have at least n first sub-line segments, is electrically connected to the $(N-n)_{th}$ second sub-line segment 11 through a first connecting line and forms a first touch control electrode; and the $N_{th}$ first sub-line segment of the first shading stripe forms a first touch control electrode, wherein N and n are positive integers and n is less than N.

10. A display device, comprising: a display panel; a line polarizer provided on a display side of the display panel; and a quarter-wave plate disposed on a side of the linear polarizer away from the display panel, wherein the linear polarizer comprises:
   a base plate;
   a plurality of shading stripes equally spaced in parallel on the base plate; and
   a transparent stripe formed between every two of the plurality of shading stripes adjacent to each other, wherein the shading stripes comprise a conductive material, and at least a portion of the shading stripes is also configured to detect touch position,
   wherein the display device further comprises a control unit and a first touch-control drive circuit, the first touch-control drive circuit is electrically connected to at least a portion of the shading stripes, and the control unit is configured to control the first touch-control drive circuit in the first time period so as to acquire a first touch signal and determine touch position, and
   wherein the linear polarizer comprises a plurality of first touch detection areas having a block shape and arranged in an array, the shading stripes comprise first sub-line segments which are located in the first touch detection areas, the first sub-line segments within one of the plurality of first touch detection areas are electrically connected to form a first touch control electrode, and the first sub-line segments within different first touch detection areas are insulated from each other.

11. The display device of claim 10, wherein the display panel is an organic light emitting diode display panel comprising an organic light emitting diode which comprises a first electrode, a second electrode, and a light emitting layer disposed between the first electrode and the second electrode, wherein the first electrode is disposed on the light emitting side of the display panel;
   the display device further comprises a piezoresistor arranged between the first touch control electrode of the linear polarizer and the first electrode, one surface of the piezoresistor is arranged in contact with the first touch control electrode, and the other surface is arranged in contact with the first electrode, and the piezoresistor is arranged corresponding to the areas between adjacent pixels areas;
   the display device further comprises a second touch-control drive circuit which is electrically connected to the first electrode and the first touch control electrode, the control unit is also configured to control the second touch-control drive circuit in the second time period within a display period of one frame so as to acquire a second touch signal and determine amount of touch pressure, and the first time period does not overlap with the second time period.

12. The display device of claim 10, wherein the display panel is an organic light emitting diode display panel comprising an organic light emitting diode which comprises a first electrode, a second electrode, and a light emitting layer disposed between the first electrode and the second electrode, the first electrode is disposed on the light emitting side of the display panel;
   when the linear polarizer comprises a plurality of second touch control electrodes arranged in parallel, the first electrode is a stripe-like electrode, the first electrode intersects with the first touch control electrode, the first touch control electrode and the first electrode cooperate to detect the touch position;
   the control unit is configured to control the first touch-control drive circuit in the first time period within a display time of a frame so as to acquire the first touch signal and determine the touch position.

13. The display device of claim 10 further comprising a package film disposed on a side of the quarter-wave plate away from a display panel.

14. The display device of claim 13 further comprising a protective plate disposed on a side of the package film away from a display panel.

15. The display device of claim 10, wherein the linear polarizer comprises a plurality of second touch detection areas arranged in parallel, the shading stripes within one of the plurality of second touch detection areas are electrically connected to form a second touch control electrode, and the shading stripes within different first touch detection areas are insulated from each other.

16. The display device of claim 10, wherein the linear polarizer comprises a plurality of shading stripe groups, each of the shading stripe groups comprise a plurality of adjacent first shading stripes, each of the shading stripe groups forms a group of the first touch detection areas;
   the first shading stripes are divided in their extending direction to from the first sub-line segments, the first touch control electrode in each of the first touch detection areas is electrically connected to a second sub-line segment;
   wherein the second sub-line segment is formed with a portion of the first shading stripe, and is extended to the outside of the first touch detection area and is electrically insulated with other first touch detection areas.

17. The display device of claim 16, wherein at least a second shading stripe is provided between the two of the plurality of shading stripe groups adjacent to each other.

18. The display device of claim 16, wherein the second sub-line segment corresponding to each of the first touch detection areas is arranged at the same side of each of the first touch detection areas.

* * * * *